(12) United States Patent
Wakabayashi et al.

(10) Patent No.: US 6,603,191 B2
(45) Date of Patent: Aug. 5, 2003

(54) SEMICONDUCTOR DEVICE AND METHOD OF MANUFACTURING THE SAME

(75) Inventors: Takeshi Wakabayashi, Sayama (JP); Osamu Kuwabara, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 16 days.

(21) Appl. No.: 09/858,230

(22) Filed: May 15, 2001

(65) Prior Publication Data

US 2001/0042902 A1 Nov. 22, 2001

(30) Foreign Application Priority Data

May 18, 2000 (JP) ........................................ 2000-146012
May 19, 2000 (JP) ........................................ 2000-147245

(51) Int. Cl.$^7$ ............................................ H01L 23/544
(52) U.S. Cl. ...................... 257/620; 257/738; 257/778; 257/795
(58) Field of Search ............................... 257/620, 795, 257/738, 778; 438/113, 114, 108

(56) References Cited

U.S. PATENT DOCUMENTS

| | | | |
|---|---|---|---|
| 5,155,068 A | | 10/1992 | Tada |
| 5,977,641 A | | 11/1999 | Takahashi et al. |
| 5,989,982 A | | 11/1999 | Yoshikazu |
| 6,004,833 A | * | 12/1999 | Kovats et al. .............. 438/107 |
| 6,157,080 A | * | 12/2000 | Tamaki et al. .............. 257/738 |
| 6,174,751 B1 | * | 1/2001 | Oka .............. 438/113 |
| 6,180,435 B1 | * | 1/2001 | Ise et al. .............. 438/113 |
| 6,265,783 B1 | * | 7/2001 | Juso et al. .............. 257/786 |
| 6,321,734 B1 | * | 11/2001 | Kaminaga et al. .............. 123/634 |

FOREIGN PATENT DOCUMENTS

| | | |
|---|---|---|
| EP | 0 706 208 | 4/1996 |
| EP | 0 853 337 | 7/1998 |
| JP | 8-70081 | 3/1996 |
| JP | 11-121507 | 4/1999 |
| JP | 11-224890 | 8/1999 |

OTHER PUBLICATIONS

Masatoshi Yasunaga et al: "Chip Scale Package* (CSP) A Lightly Dressed LSI Chip", Proceedings of the IEEE/CPMT International Electronics Manufacturing Technology Symposium, New York, U.S., IEEE vol. Symp. 16, pp. 169–176 XP000530088, ISBN: 0–7803–2038–7, p. 169–p. 171; Figures 1–6.

* cited by examiner

Primary Examiner—Richard Elms
Assistant Examiner—Douglas Menz
(74) Attorney, Agent, or Firm—Frishauf, Holtz, Goodman & Chick, P.C.

(57) ABSTRACT

The back surface of a semiconductor wafer having a plurality of chip-forming regions each provided with a plurality of connection pads on the surface is bonded to a dicing tape, followed by fully cutting the semiconductor wafer along a cut line so as to form a cutting groove. Then, a front side protective film is formed on the front surface. The front side protective film has an open portion exposing the central portion of the connection pad, and is filled in the cutting groove. After formation of a columnar electrode connected to the connection pad via a wiring, a sealing film is formed on the front side protective film. Further, the cutting groove filled with the front side protective film is cut in substantially the center in the width direction, followed by peeling off the dicing tape so as to form individual semiconductor devices each forming a chip.

14 Claims, 11 Drawing Sheets

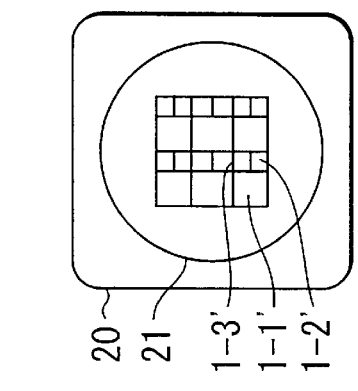
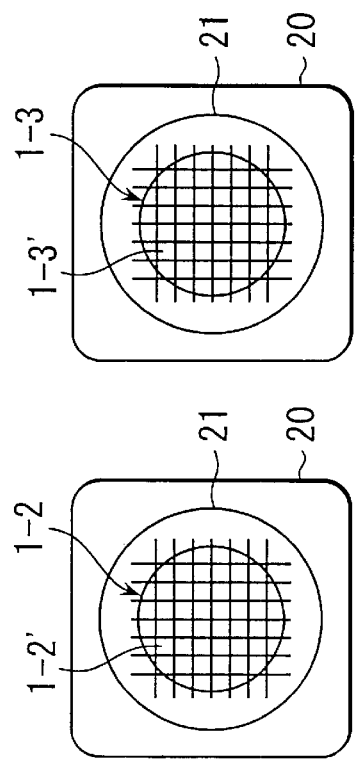
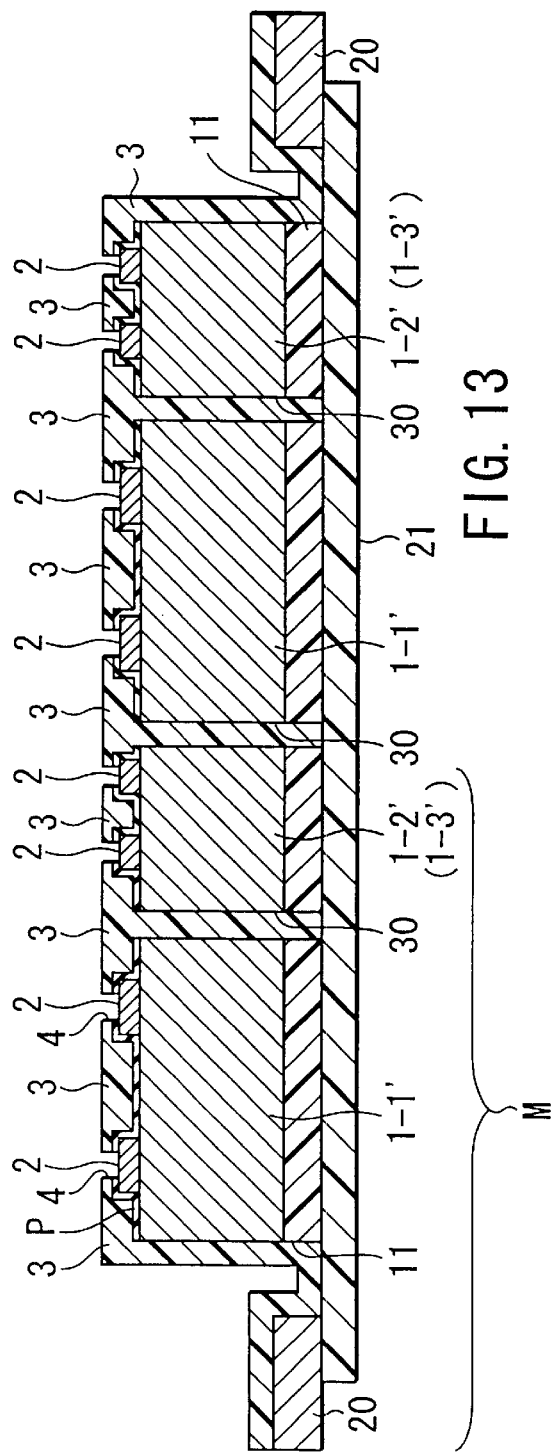

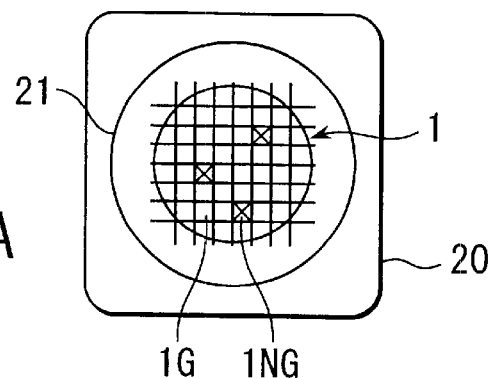
FIG. 18A
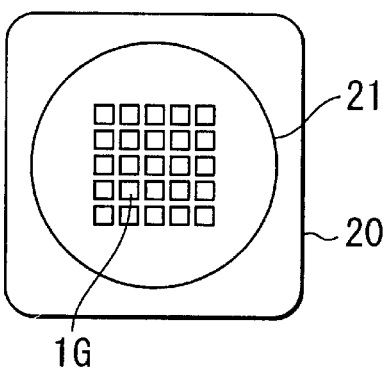 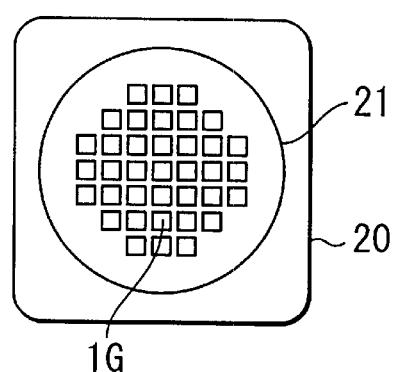
FIG. 18B  FIG. 18C
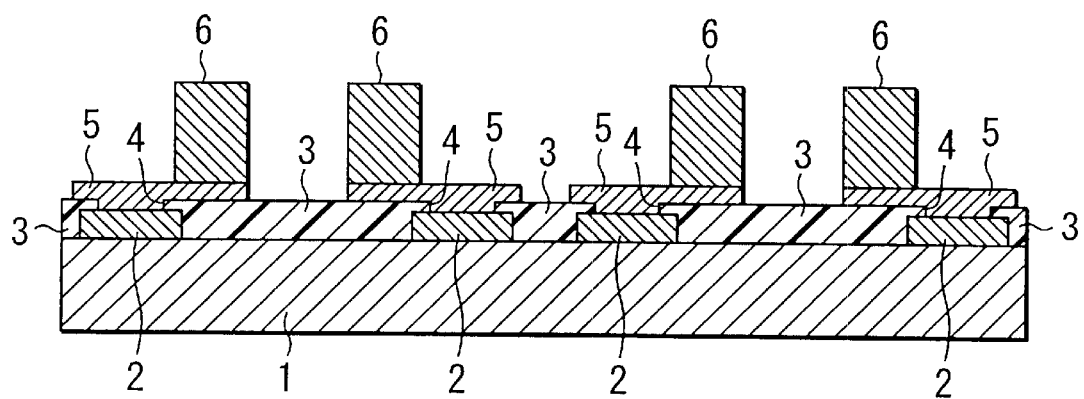
FIG. 19 PRIOR ART

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Applications No. 2000-146012, filed May 18, 2000; and No. 2000-147245, filed May 19, 2000, the entire contents of both of which are incorporated herein by reference.

BACKGROUND OF THE INVENTION

1. Field of the Invention

The present invention relates to a semiconductor device of a CSP (Chip Size Package) structure and a method of manufacturing the same.

2. Description of the Related Art

In compliance with requests for miniaturization and reduction in the thickness of electronic appliances, a semiconductor device of a CSP (Chip Size Package) structure, in which the size of a semiconductor chip is rendered substantially equal to the size of a package, has come to be widely used. A method of manufacturing a semiconductor device of this type will now be described with reference to FIGS. 19 to 22.

In the first step, a plurality of connection pads 2 consisting of, for example, aluminum electrodes are formed on a front surface (circuit surface) of a silicon wafer (semiconductor wafer) 1, followed by forming a protective covering film (not shown) consisting of, for example, silicon oxide or silicon nitride on the entire front surface of the silicon wafer 1 except the central portion of each of the connection pads 2, as shown in FIG. 19. Then, a front side protective film 3 is formed on the protective covering film except the central portion of each of the connection pads 2.

For forming the front side protective film 3, the entire surface on the side of the circuit surface of silicon wafer 1 is coated with, for example, a polyimide-based resin material, followed by curing the resin coating and subsequently applying a resist patterning and a protective film patterning by using an etchant. Then, the resist is peeled off so as to form the front side protective film 3.

In the next step, a wiring 5 is formed on each of the connection pads 2 exposed to the outside via an open portion 4 formed in the front side protective film 3. As described herein later, the wiring 5 is formed in a manner to be connected to each of columnar electrodes 6. As a result, it is possible to arrange the columnar electrodes 6 to form a matrix in the central portion of the wafer so as to increase the pitch of the connection pads 2 formed in the peripheral portion alone of each semiconductor device, to increase the electrode area, to increase the bonding strength with a circuit substrate, and to improve the reliability of the connection.

After formation of the wiring 5, a plurality of columnar electrodes 6 are formed in predetermined positions on the wirings 5. For forming the columnar electrode 6, a resist (not shown) for forming the columnar electrode is coated in a thickness of, for example, 100 to 150 μm, followed by curing the coated resist. Then, a resist patterning is applied, followed by applying an electroplating to the open portion formed by the resist patterning treatment so as to form the columnar electrode 6.

In the next step, the entire surface of the silicon wafer 1 including the columnar electrodes 6 is molded with a resin material such as an epoxy resin so as to form a sealing film 7 slightly thicker than the columnar electrode 6, as shown in FIG. 20. Further, after the sealing film 7 is cured, the resultant silicon wafer 1 is moved onto a grinding process table (not shown) so as to have the front side of the sealing film 7 polished by a grinding apparatus, with the result that an edge surface 61 of the columnar electrode 6 is exposed to the outside on the upper surface of the sealing film, as shown in FIG. 21. Still further, the back surface of the silicon wafer 1 is polished by the grinding process so as to decrease the thickness of the silicon wafer 1 to a predetermined level. Then, a process of marking the article number and the lot number is applied to the polished back surface of the silicon wafer 1.

In the next step, the silicon wafer 1 is disposed on a dicing tape (not shown) mounted to a dicing frame, with the back surface of the silicon wafer 1 facing downward, followed by cutting the silicon wafer 8 along cut lines 8, as shown in FIG. 22, so as to obtain individual semiconductor devices 10 each fixed to the semiconductor substrate for each chip.

In the conventional semiconductor device 10 manufactured as described above, the sealing film 7 is formed first on the silicon wafer 1, followed by cutting the silicon wafer 1 along the cut lines 8. It follows that a side surface 1a including the cut surface of each of the separated semiconductor devices 10 and the back surface of each separated semiconductor device 10 are exposed to the outside. As a result, serious problems are generated. For example, water or moisture permeates into the boundary region between the sealing film 7 and the front side protective film 3 in the exposed surface so as to oxidize the wiring 5. Also, cracks are generated between the sealing film 7 and the front side protective film 3 so as to lower the reliability. In addition, since the semiconductor substrate is exposed to the outside, the semiconductor substrate tends to be broken in, for example, handling the semiconductor substrate.

BRIEF SUMMARY OF THE INVENTION

The present invention is directed to a semiconductor device of, for example, a CSP structure, which is obtained by cutting a semiconductor wafer, and is intended to provide a semiconductor device in which a protective film is formed to cover at least the cut surface of the semiconductor substrate so as to improve the reliability, and to provide a method of manufacturing the particular semiconductor device.

According to a first aspect of the present invention, which permits achieving the above-noted object, there is provided a semiconductor device comprising a semiconductor substrate including a front surface having a plurality of connection pads formed thereon, a back surface opposite to the front surface, and a side surface positioned between the front surface and the back surface; and a front side protective film having open portions exposing the plural connection pads formed on the front surface of the semiconductor substrate to the outside and formed to cover the side surface of the semiconductor substrate.

According to a second aspect of the present invention, which permits achieving the above-noted object, there is provided a method of manufacturing a semiconductor device, comprising the steps of preparing a silicon wafer including a plurality of chip forming regions each provided with a plurality of connection pads on its front surface; separating the silicon wafer into individual chip forming regions so as to form a plurality of semiconductor substrates arranged a predetermined distance apart from each other; forming a front side protective film covering the front surface of each of the semiconductor substrates, having open portions formed to expose the plural connection pads to the outside, and filling the clearance among the plural semiconductor substrates; and cutting each of the semiconductor substrates with a width smaller than the clearance between the semiconductor substrates.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 12A to 12D are views used for describing a method of manufacturing a semiconductor device according to a second embodiment of the present invention, and schematically show how the semiconductor substrates cut from different kinds of silicon wafers are arranged;

FIG. 13 is a cross sectional view showing the manufacturing step following the step shown in FIG. 12 in the manufacturing process according to the second embodiment of the present invention;

FIGS. 18A to 18C are cross sectional views each showing a silicon wafer and used for describing a modification of the manufacturing process according to the second embodiment of the present invention;

FIG. 19 is a cross sectional view showing in a magnified fashion a silicon wafer and used for describing the manufacturing method of a conventional semiconductor device;

DETAILED DESCRIPTION OF THE INVENTION

Figure 1:
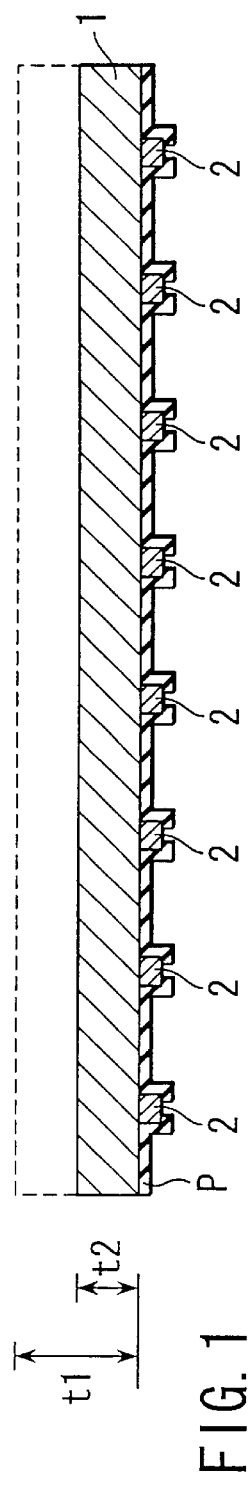
FIG. 1 is a cross sectional view showing a silicon wafer prepared first and having a plurality of connection pads, said cross sectional view being used for describing a method of manufacturing a semiconductor device according to one embodiment of the present invention.

Semiconductor devices and manufacturing methods thereof according to some embodiments of the present invention will now be described in detail with reference to the accompanying drawings.

FIGS. 1 to 9 collectively show a manufacturing method of a semiconductor device according to a first embodiment of the present invention. The construction of the semiconductor device of this embodiment will now be described together with the manufacturing method thereof. Incidentally, in these figures, those portions which are common with the prior art described previously are denoted by the same reference numerals.

In the first step, prepared is a silicon wafer 1 (semiconductor wafer) having a plurality of connection pads 2 formed on the front surface (circuit surface) and having a thickness $t_1$. The silicon wafer 1 has a plurality of chip-forming regions that are to be cut into semiconductor substrates for chips in the final step shown in FIG. 9 referred to herein later so as to form a plurality of semiconductor devices 10. The plural connection pads 2 formed on the front surface of the silicon wafer 1 are positioned in the peripheral portion of each of the chip-forming regions so as to be connected to integrated circuit elements (not shown) formed on the central portion of the chip forming region. A protective covering film P formed of an insulating material such as silicon oxide or silicon nitride is formed to cover the entire front surface of the silicon wafer 1. Open portions each exposing the central portion of one surface of each of the connection pads 2 to the outside are formed in the protective covering film P.

The back surface of the silicon wafer 1 is polished and/or etched by a grinding apparatus (not shown) so as to decrease the thickness of the silicon wafer 1 from the original thickness $t_1$ to a thickness $t_2$ that is about ⅓ to ⅔ of the original thickness $t_1$.

Figure 2:
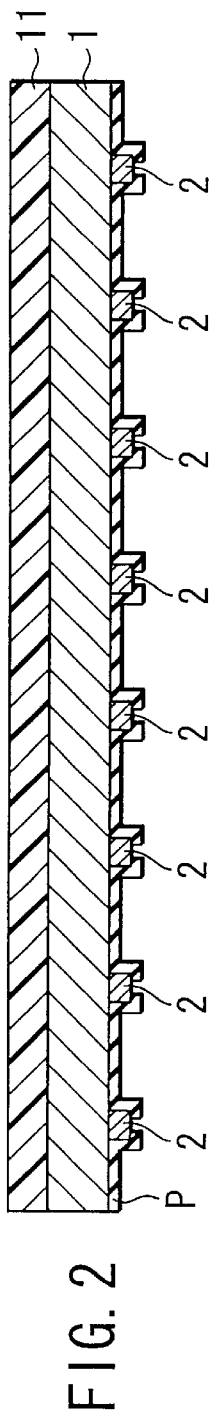
FIG. 2 is a cross sectional view showing the silicon wafer and used for describing the step following the step shown in FIG. 1 in the manufacturing process according to the first embodiment of the present invention.

In the next step, a back side protective film 11 is formed on the back surface of the polished silicon wafer 1 by means of coating of a protective resin formed of an organic resin material such as polyimide or epoxy resin in a predetermined thickness, as shown in FIG. 2. It is possible for the back side protective film 11 to be of a single layer structure of resin such as polyimide or epoxy resin, or of a laminate structure consisting of a plurality resin layers.

The back side protective film 11 is formed in order to suppress the influence of light or electromagnetic waves transmitted from the back surface and to cover the entire periphery of the semiconductor substrate together with a front side protective film that is to be described herein later. Therefore, it is desirable to form the back side protective film 11. However, it is not absolutely necessary in the present invention to form the back side protective film 11. In other words, it is possible to omit the step of forming the back side protective film 11 so as not to form the back side protective film 11.

Where the back side protective film 11 is formed as described above, the thickness of the semiconductor device that is finally formed is increased in an amount corresponding to the thickness of the back side protective film 11. The back surface of the silicon wafer 1 shown in FIG. 1 is polished in order to suppress the increase in the thickness of the final semiconductor device 10, as describe of above. Where the thickness of the final semiconductor device need not be worried about, it is unnecessary to polish the back surface of the silicon wafer 1.

Figure 3:
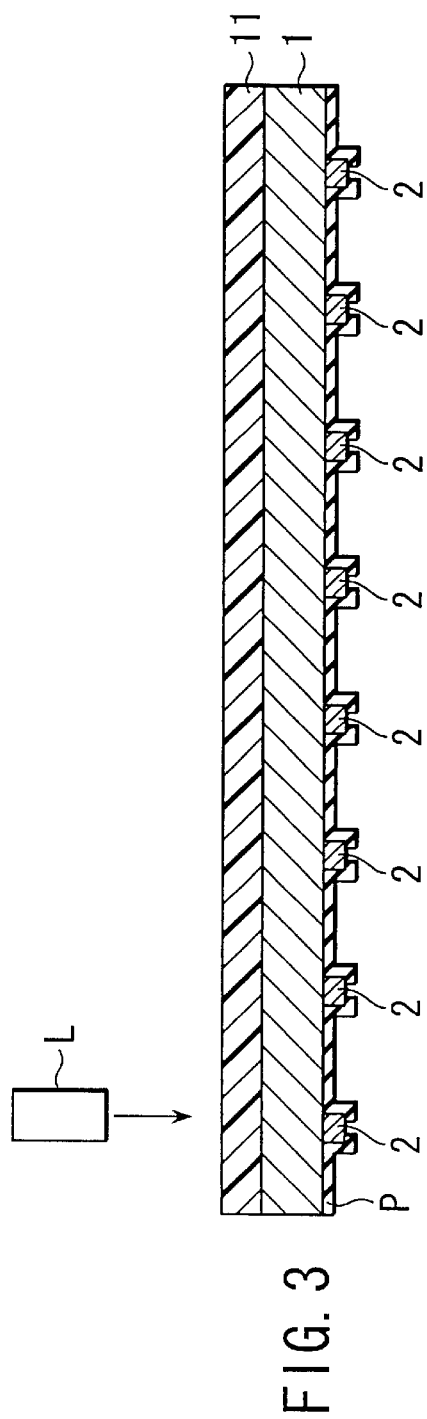
FIG. 3 is a cross sectional view showing the silicon wafer and used for describing the step following the step shown in FIG. 2 in the manufacturing process according to the first embodiment of the present invention.

In the next step, the back side protective film 11 is cured and, then, product information such as a lot number and product number are marked on the back side protective film 11 by using, for example, a laser marker L, as shown in FIG. 3.

Figure 4:
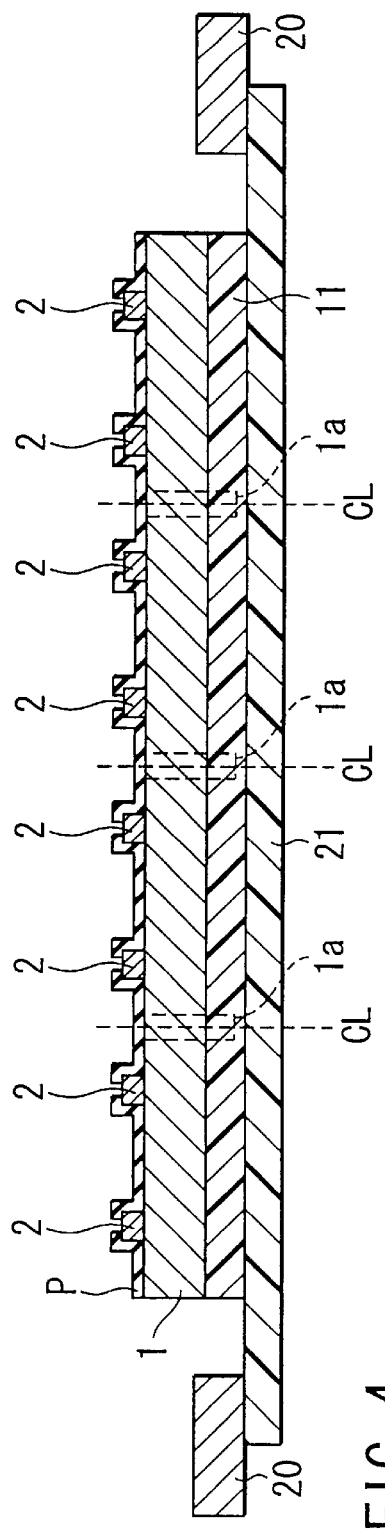
FIG. 4 is a cross sectional view showing the silicon wafer and used for describing the step following the step shown in FIG. 3 in the manufacturing process according to the first embodiment of the present invention.

Then, after completion of the marking, the silicon wafer 1 is mounted and bonded to a dicing tape 21 mounted to a dicing frame (support member) 20 such that the back side protective film 11 of the silicon wafer 1 is in direct contact with the dicing tape 21, as shown in FIG. 4. It should be noted that an adhesive material is formed on the upper surface of the dicing tape 21 so as to permit the silicon wafer 1 to be strongly fixed to the dicing tape 21.

After the silicon wafer 1 is bonded to the dicing tape 21, a dicing treatment is applied to the silicon wafer 1 along cut lines CL so as to form cutting grooves 1a, as shown in FIG. 4. In this case, the dicing treatment is applied from the side of the protective covering film P such that each of the cutting grooves 1a reaches at least the back side protective film 11 so as to cut the silicon wafer 1 completely. It is possible to apply the dicing treatment such that the cutting groove 1a reaches an intermediate portion of the back side protective film 11, i.e., a half cut, or extends completely through the back side protective film 11, i.e., full cut.

After completion of the dicing treatment, the silicon wafer 1 is separated into a plurality of semiconductor substrates 1' corresponding to the individual chips because the silicon wafer 1 is subjected to the full cut. However, since the lower surface of each of the semiconductor substrate 1' is fixed to the dicing tape 21 via the back side protective film 11, the separated semiconductor substrates 1 are not scattered. In the following description, all the semiconductor substrates 1' are collectively called the silicon wafer 1 for the sake of convenience.

Figure 5:
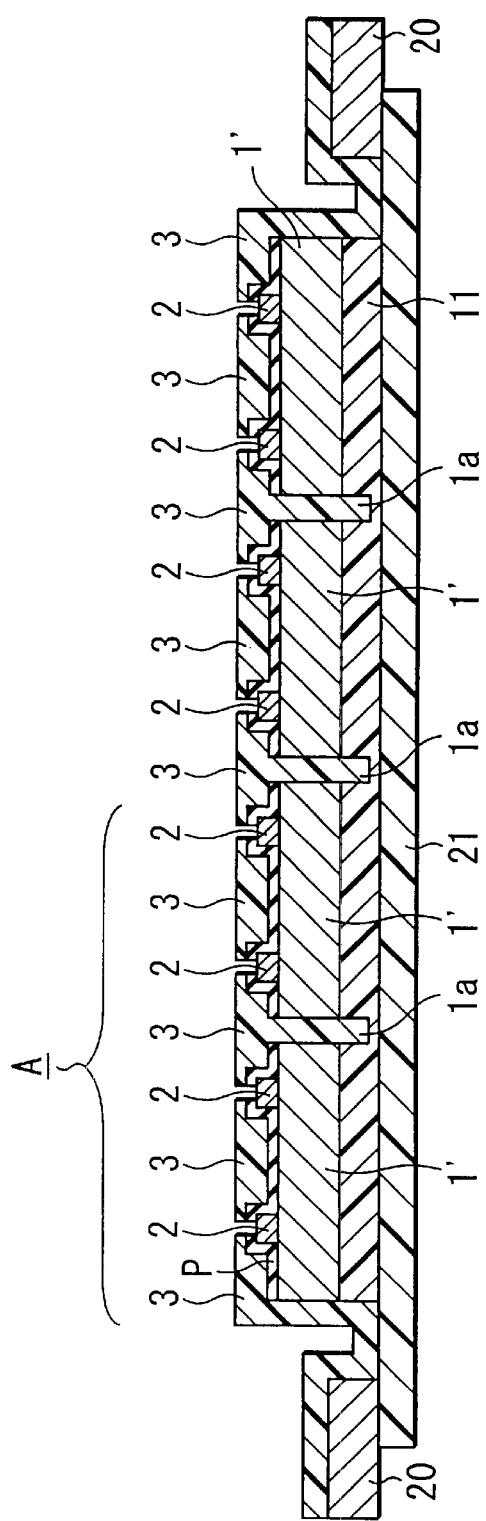
FIG. 5 is a cross sectional view showing the silicon wafer and used for describing the step following the step shown in FIG. 4 in the manufacturing process according to the first embodiment of the present invention.

Then, a front side protective film 3 is formed on the silicon wafer 1 fixed to the dicing tape 21 of the dicing frame 20 and having the cutting grooves 1a formed therein such that the front side protective film 3 covers the side surfaces (circumferential side surfaces) of the silicon wafer 1 and the front surfaces of the connection pads 2 except the central portions of the connection pads 2, as shown in FIG. 5. In addition, the cutting grooves 1a are loaded with the front side protective film 3. As a result, the circumferential side surfaces 1b of the semiconductor substrates 1a, which are the cut surfaces of the silicon wafer 1, are covered with the portions of the front side protective film 3 formed within the cutting grooves 1a, as shown in FIG. 6 showing in a magnified fashion a gist portion A shown in FIG. 5.

The front side protective film 3 is formed as follows. In the first step, the protective covering film P formed on the front side of the silicon wafer 1 and the connection pads 2 exposed to the outside through the open portions of the protective covering film P are coated with, for example, a polyimide series resin material. It is desirable to employ a spin coating method for the coating of the resin material. Alternatively, however, it is also possible to employ any appropriate coating method, such as a printing method using a squeegee or a coating method using an ink ejection from a nozzle. Then, after the front side protective film 3 coated on the surface of the silicon wafer 1 is cured, the side surface and the upper surface are coated with a photoresist (not shown). Further, the photoresist is patterned on the front side surface of the silicon wafer 1, followed by patterning the front side protective film 3 on the basis of the patterned photoresist, thereby forming open portions 4 exposing the central portions of the connection pads to the outside in the front side protective film 3, as in the conventional method described previously. As a result, formed is the front side protective film 3 having a predetermined patterning applied thereto. Then, the photoresist is peeled off. In this case, it is desirable for the front side protective film 3 to consist of a resin layer containing a material substantially equal to the main component of the back side protective film 11 described previously in order to ensure reliability in a variety of environments.

Figure 6:
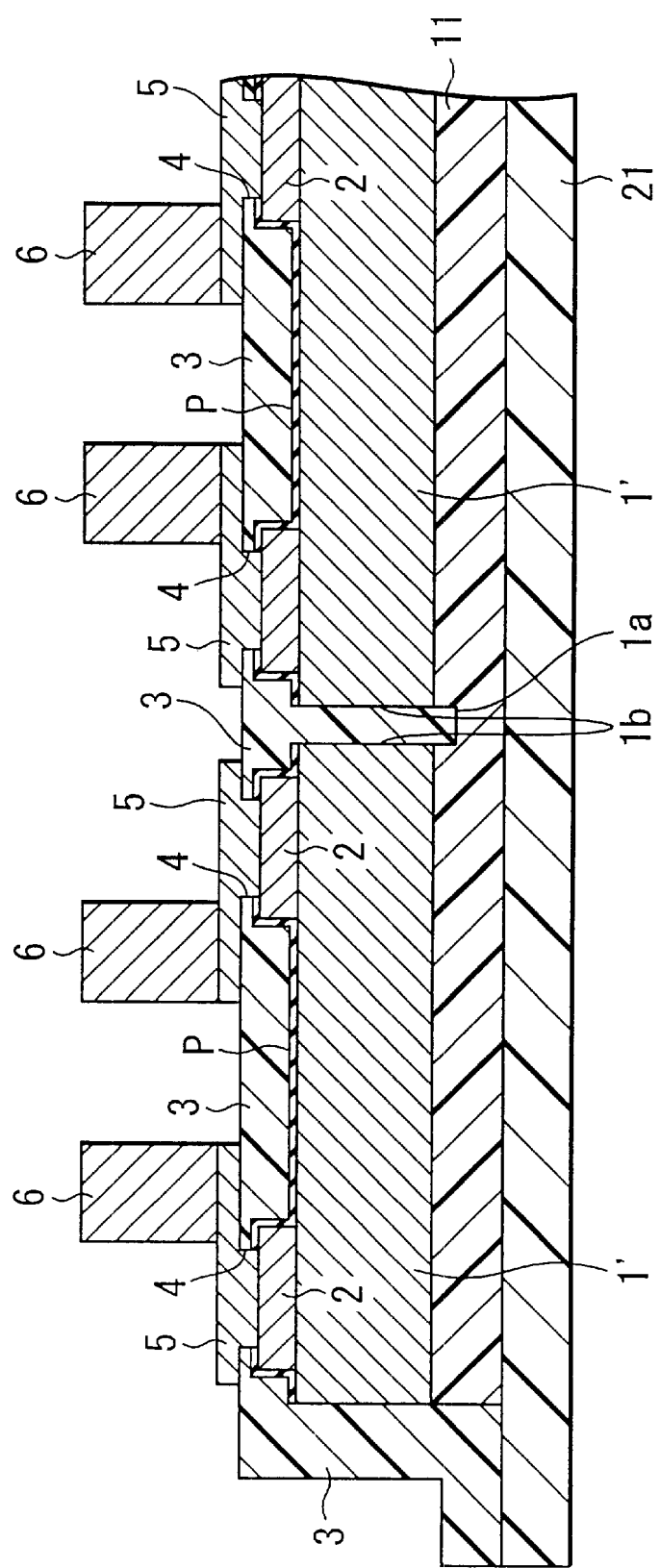
FIG. 6 is a cross sectional view showing the silicon wafer and used for describing the step following the step shown in FIG. 5 in the manufacturing process according to the first embodiment of the present invention.

In the next step, wirings 5 are formed on the connection pads 2 exposed to the outside via the open portions 4 formed in the front side protective film 4, as shown in FIG. 6.

The wirings 5 are formed as follows. In the first step, a UBM (Under Bump Metal) layer is deposited on the entire surface of the front side protective film 3 and the connecting pads 2 by means of, for example, a sputtering treatment after the peeling of the photoresist film. Then, after a photoresist for the wirings is coated and cured, a patterning having openings of a predetermined shape is applied by a photolithography technology so as to form wirings of a predetermined shape, followed by applying an electroplating to the open portion made in the photoresist, thereby forming a plurality of wirings 5 having one end connected to each of the connection pads 2 and the other end extending on the front side protective film 3. Incidentally, under the state that the wirings 5 are formed by the electroplating, the UBM layer deposited on the entire front surface of the front side protective film 3 is left as the plating electrode including the UBM layer portion formed by vapor deposition on the dicing frame 20.

After formation of the wirings 5 as described above, columnar electrodes 6 are formed on predetermined positions of the other ends of each of the wirings 5. For forming the columnar electrodes 6, a photoresist (not shown) for forming the columnar electrodes is coated in a thickness of about, for example, 100 to 150 µm, followed by curing the photoresist and forming open portions exposing the central portions of the other ends of the wirings 5 to the outside. Then, an electroplating is applied to each of the open portions so as to form the columnar electrode 6. In applying the electroplating, the UBM layer formed by vapor deposition on the entire surface of the front side protective film 3 and on the dicing frame 20 is used as one of the electrodes. After the plating treatment, the photoresist for forming the columnar electrodes is peeled off, and the UBM layer formed by vapor deposition on an undesired portion is removed by etching. FIG. 6 shows the state after completion of the steps described above.

As described above, in the step of forming the wiring 5 and the columnar electrode 6 shown in FIG. 6, the UBM layer formed by vapor deposition on the dicing frame 20 is left unremoved for use as a plating electrode. It follows that it is possible to perform the electroplating treatment to form the wiring 5 and the columnar electrode 6 without employing the conventional technique of forming separately an electrode on the silicon wafer 1.

Figure 7:
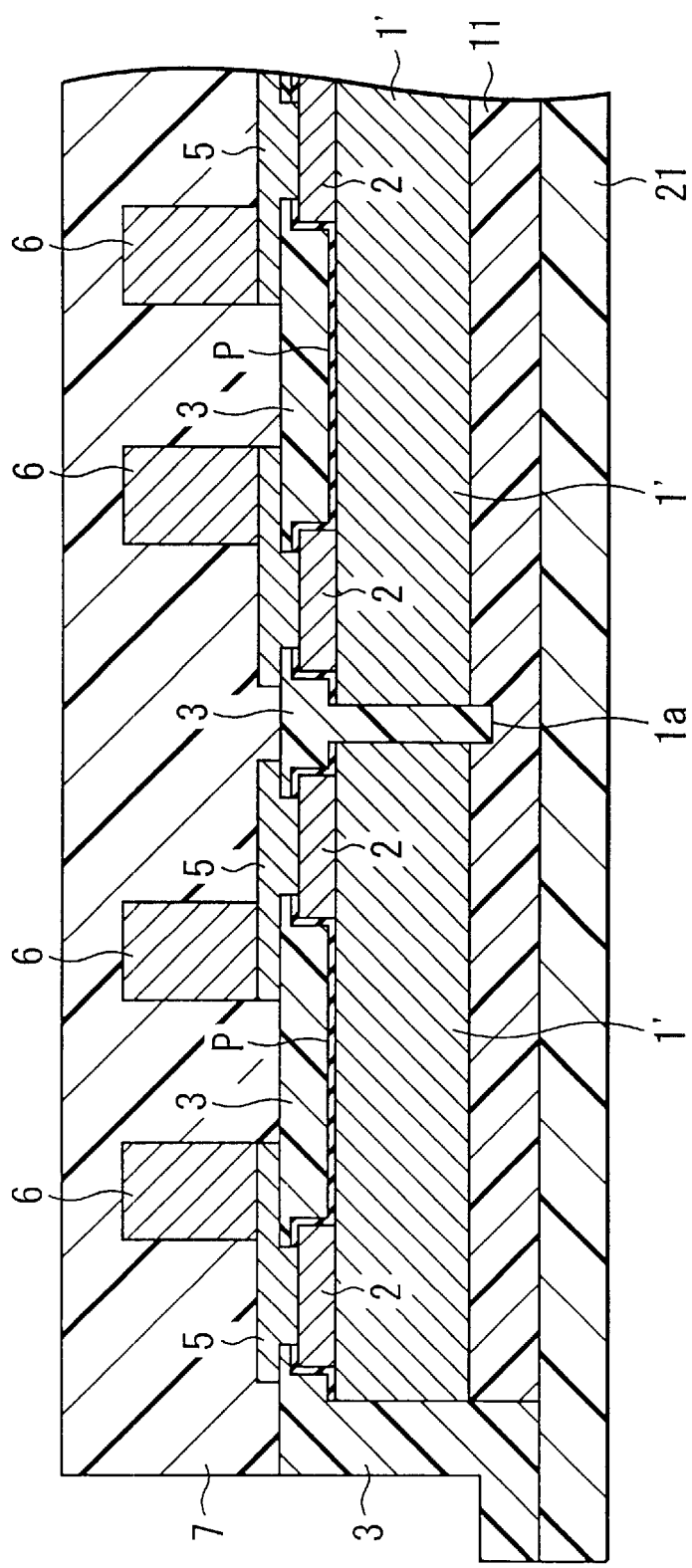
FIG. 7 is a cross sectional view showing the silicon wafer and used for describing the step following the step shown in FIG. 6 in the manufacturing process according to the first embodiment of the present invention.

After formation of the structure shown in FIG. 6, a sealing film 7 consisting of a resin material such as polyimide or an epoxy resin is formed by, for example, a molding method in a manner to cover the entire front surface of the silicon wafer 1 including the columnar electrodes 6, as shown in FIG. 7. It is possible for the sealing film 7 to be of a single layer structure consisting of polyimide, epoxy resin, etc. or to be of a laminate structure consisting of these resin layers. In this case, it is desirable for the sealing film 7 to be formed of a resin layer containing a material substantially equal to the main component of the back side protective layer 11 described previously in order to ensure a reliability relative to the change in the environment.

Figure 8:
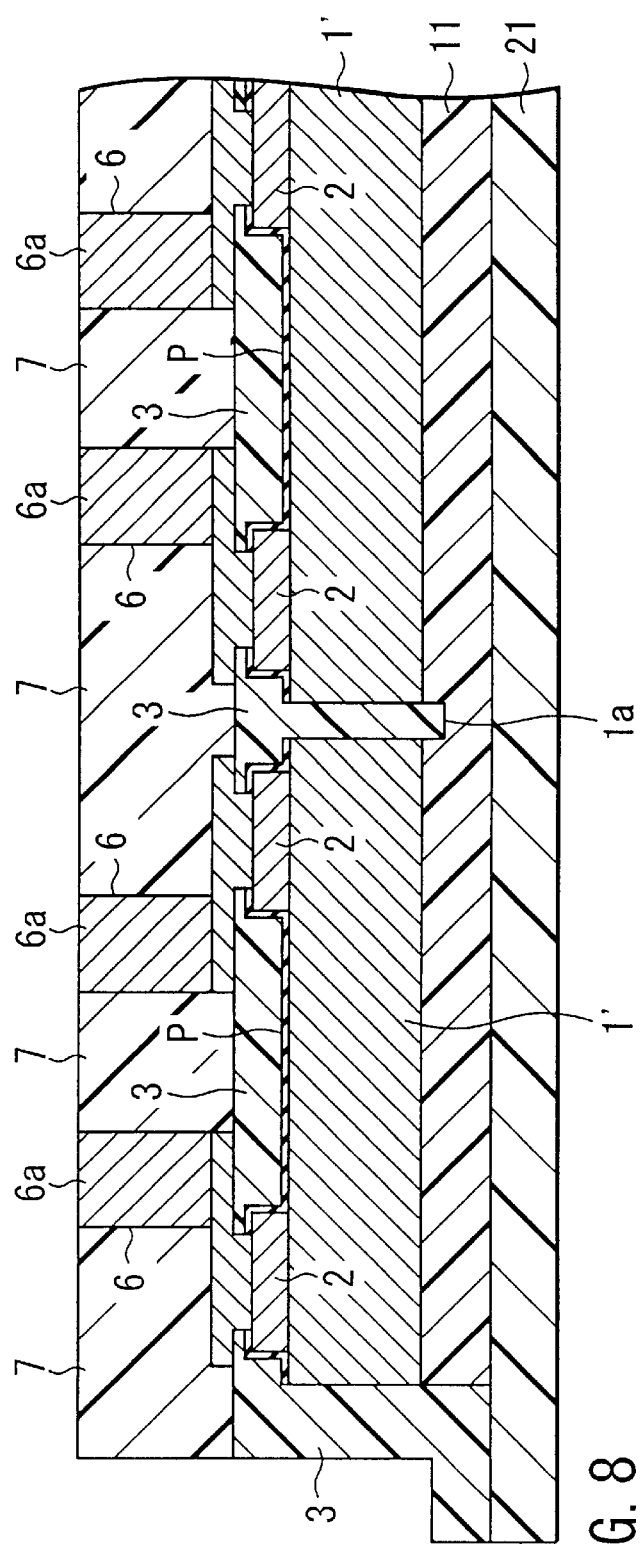
FIG. 8 is a cross sectional view showing the silicon wafer and used for describing the step following the step shown in FIG. 7 in the manufacturing process according to the first embodiment of the present invention.

After curing of the sealing film 7, the entire silicon wafer 1 is disposed on the grinding process table (not shown) so as to polish and/or etch the front surface side of the sealing film 7 by a grinding apparatus so as to expose one surface 6a of the columnar electrode 6 to the outside, as shown in FIG. 8. A native oxide film on the surface of the exposed surface 6a is preferably removed, followed by, as required, a metallizing treatment such as a solder printing treatment (not shown).

Figure 9:
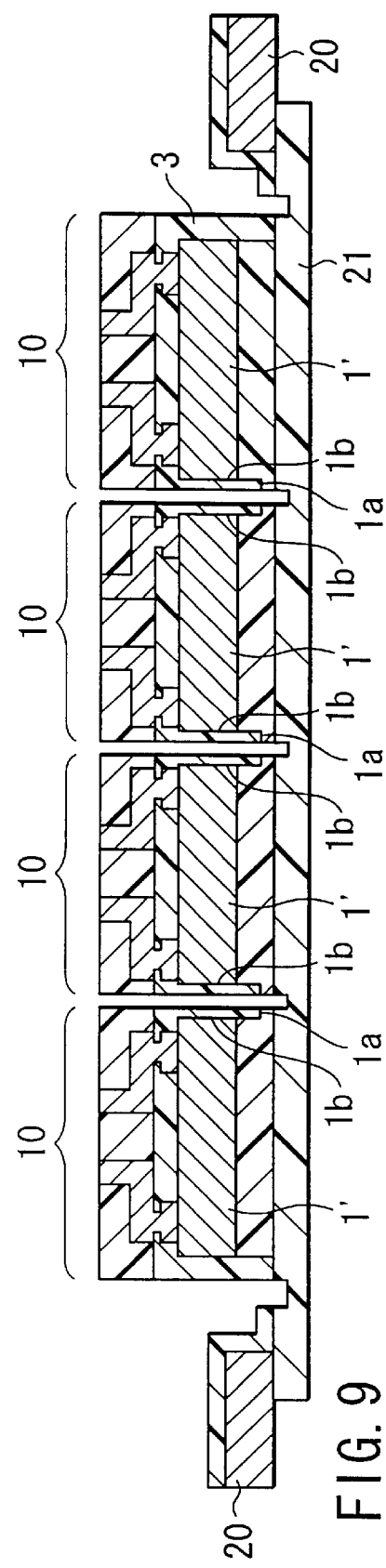
FIG. 9 is a cross sectional view showing the silicon wafer and used for describing the step following the step shown in FIG. 8 in the manufacturing process according to the first embodiment of the present invention.

In the next step, substantially the center in the width direction of the part of the surface side protective film 3 loaded in the cutting groove 1a is subjected to a dicing treatment with a width smaller than the width of the cutting groove 1a, as shown in FIG. 9. As a result, the portion of the front side protective film 3 is left unremoved in a predetermined thickness on the circumferential side surface 1b of each semiconductor substrate it. Then, the dicing tape 21 is peeled off so as to separate the individual semiconductor substrates, thereby obtaining a plurality of semiconductor devices 10.

As described above, in the first embodiment of the present invention, the front surface and the side surface of the individual semiconductor device 10 are covered with the front side protective film 3. Also, the back surface of the semiconductor device 10 is covered with the back side protective film 11. It follows that the entire surface of the semiconductor device 10 is covered with the protective film. As a result, water is unlikely to enter the boundary region between the sealing film 7 and the front side protective film 3, thereby preventing the wiring 5 from being oxidized. It is also possible to prevent the occurrence of a crack between the sealing film 7 and the front side protective film 3 so as to improve the reliability. Further, it is possible for the back side protective film 11 to suppress the influence of light and electromagnetic waves coming from the back surface. What should also be noted is that, since no surface of the semiconductor substrate is exposed to the outside, it is possible to prevent breakages of the semiconductor substrate, and the handling in the step of transferring the semiconductor device 10 onto a tray is markedly facilitated.

Figure 10:
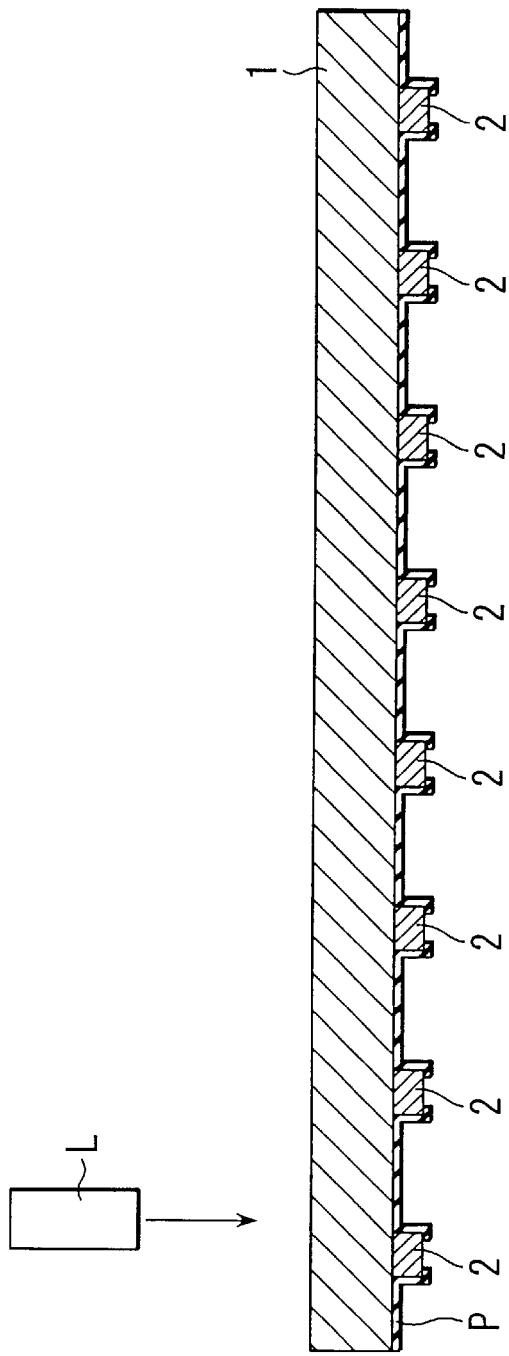
FIG. 10 is a cross sectional view showing a silicon wafer for describing a modification of the manufacturing method according to the first embodiment of the present invention.

In the embodiment described above, the back surface of the silicon wafer 1 is polished by a grinding treatment, and product information marking such as a lot number and the product number on the semiconductor device 10 is made on the back side protective film 11 by using, for example, a laser marker L after formation of the back side protective film 11, as shown in FIG. 4. However, the marking treatment is not limited to the method described above. For example, it is possible to apply the marking of the lot number and product number directly on to the polished back surface of the silicon wafer 1, as shown in FIG. 10.

Figure 11:
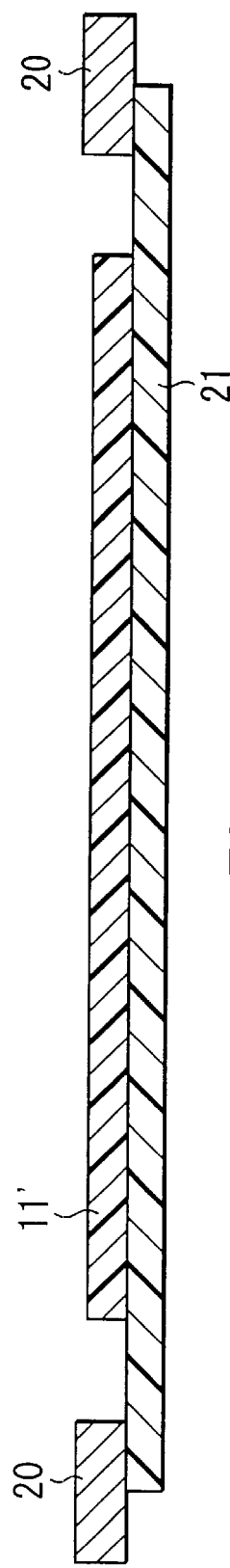
FIG. 11 is a cross sectional view showing the silicon wafer and used for describing the step following the step shown in FIG. 10 in the manufacturing process according to the first embodiment of the present invention.

In the embodiment described above, the back side protective film 11 is formed by coating the back surface of the silicon wafer 1 with a protective resin, as shown in FIG. 2. However, the formation of the back side protective film 11 is not limited to the particular method. For example, it is possible to coat the dicing tape 21 mounted to the dicing frame 20 with a protective resin 11' formed of an organic resin material such as polyimide in a predetermined thickness as shown in FIG. 11, followed by bonding the back surface of the silicon wafer 1 to the coated protective film 11'. In this case, the protective film 11' performs the function of the back side protective film.

FIGS. 12A to 18C collectively show a method of manufacturing a semiconductor device according to a second embodiment of the present invention. The construction of the semiconductor device according to the second embodiment of the present invention will now be described together with the manufacturing method thereof with reference to these figures. In these figures, those portions which are common with the first embodiment are denoted by the same reference numerals.

The second embodiment is featured in that, after preparation of a silicon wafer in which the individual semiconductor substrates for chips are formed by the process shown in FIGS. 1 to 4 referred to previously in conjunction with the first embodiment, the individual semiconductor substrates are rearranged. In the second embodiment, prepared are three different kinds of silicon wafers in each of which semiconductor substrates are made individual for chips by the processes described above, and formed is a multi-chip module in which three kinds of semiconductor substrates separated from each silicon wafer form a set.

In the second embodiment, different kinds of silicon wafers 1-1 to 1-3 are prepared first as shown in FIGS. 12A to 12C. The different kinds of silicon wafers represent silicon wafers differing from each other in the integrated circuit formed within the chip included in each silicon wafer.

To be more specific, the silicon wafers 1-1, 1-2 and 1-3 include semiconductor substrates 1-1', 1-2' and 1-3', respectively. Each silicon wafer is equal in construction to the silicon wafer 1 in the first embodiment and includes a plurality of chip-forming regions. As described previously in conjunction with the first embodiment, a plurality of connection pads 2 formed on the front surface are arranged in the peripheral portion of each chip-forming region so as to be connected to the integrated circuit element (not shown) formed in the control portion of each semiconductor substrate. Also, the protective covering film P covering the entire surface of the silicon wafer and made of, for example, silicon oxide or silicon nitride is formed on the front surface of each silicon wafer. An open portion exposing the central portion of each connection pad 2 is formed in the protective covering film P.

The treatments equal to those shown in FIGS. 1 to 4 are applied to the silicon wafers 1-1 to 1-3. To reiterate, the back surface of each silicon wafer is polished by a grinding treatment, the back side protective film 11 is formed, the article information is marked, and the dicing treatment is carried out so as to prepare individual semiconductor substrates 1-1', 1-2' and 1-3' in the silicon wafers 1-1, 1-2 and 1-3, respectively. Where the thickness of the semiconductor substrate need not be worried about, the polishing by grinding treatment need not be applied to the back surface of the silicon wafer, as in the first embodiment. Also, it is not absolutely necessary to form the back side protective film 11, making it possible to omit the process of forming the back side protective film 11.

In the next step, the semiconductor substrates 1-1', 1-2' and 1-3' are peeled from the dicing tape 21 and rearranged as shown in FIG. 12D. To be more specific, these semiconductor substrates are mounted on another dicing tape 21 in a manner to form blocks each consisting of, for example, the semiconductor substrates 1-1', 1-2' and 1-3' as a set. An adhesive material is formed on the upper surface of the dicing tape 21 and, thus, each of these semiconductor substrates can be strongly fixed to the dicing tape 21. In this case, an appropriate clearance is formed between the mutually facing surfaces of the semiconductor substrates. Also, an appropriate clearance is formed between the adjacent blocks, too. In this case, it is desirable to make the clearance between the adjacent blocks larger than the clearance between the mutually facing surfaces of the semiconductor substrates within each block in order to diminish the size of each multi-chip module. Also, it is possible to substantially eliminate the clearance between the mutually facing surfaces of the semiconductor substrates within each chip. In the second embodiment, clearances 30 of the same width are formed between adjacent semiconductor substrates, as shown in FIG. 13.

After completion of the rearrangement, the front side protective film 3 is formed on the semiconductor substrates 1-1', 1-2' and 1-3' mounted on the dicing tape 21 with the clearance 30 provided therebetween in a manner to cover the circumferential side surfaces of these semiconductor substrates, to cover the front surfaces of these semiconductor substrates except the central portions of the connection pads 2, and to fill the clearances 30, as shown in FIG. 13.

The front side protective film 3 can be formed by the process similar to that shown in FIG. 5 referred to previously in conjunction with the first embodiment. For example, a polyimide-based resin material is coated and, then, cured, followed by patterning the resin coating by using a photoresist so as to form the open portion 4 exposing the central portion of each of the connection pads 2 to the outside, thereby forming the front side protective film 3. In this case, it is desirable for the front side protective film 3 to be formed of a resin layer containing a material substantially equal to the main component of the back side protective film 11 referred to previously in order to ensure reliability in a variety of environments.

Figure 14:
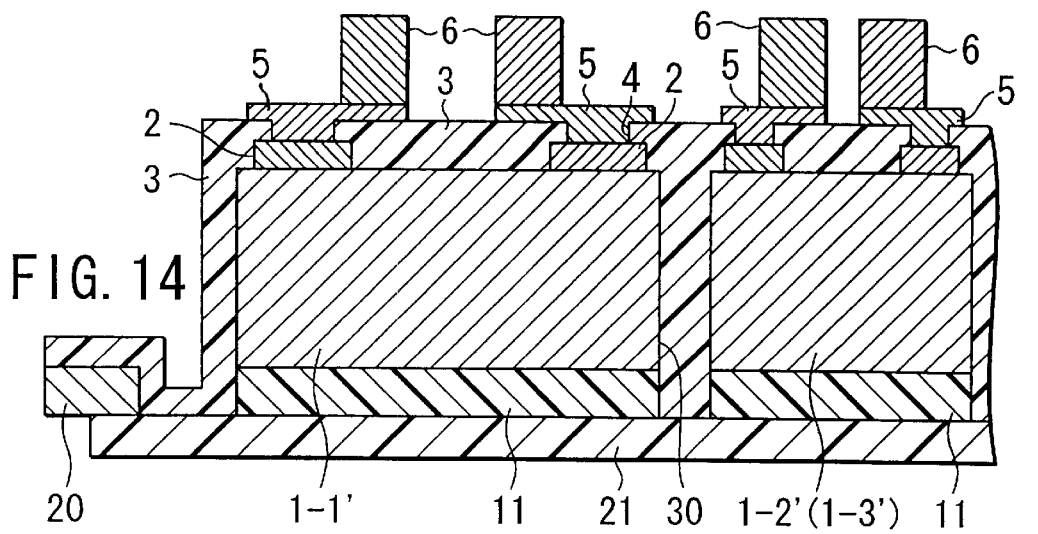
FIG. 14 is a cross sectional view showing in a magnified fashion the manufacturing step following the step shown in FIG. 13 in the manufacturing process according to the second embodiment of the present invention.

In the next step, the wiring 5 is formed on the connection pad 2 of each semiconductor substrate, said connection pad 2 being exposed to the outside through the open portion 4 made in the front side protective film 3, as shown in FIG. 14 showing in a magnified fashion a gist portion M shown in FIG. 13. The wiring 5 can be formed as in the process of FIG. 6 referred to in conjunction with the first embodiment. To reiterate, after the UBM layer is deposited on the entire surface of the front side protective film 3, a photoresist for the wiring is coated and, then, cured, followed by applying a patterning treatment in a manner to have open portions of a predetermined shape. Further, an electroplating is applied to the open portions so as to form a plurality of wirings 5 on each semiconductor substrate such that one end of the wiring 5 is electrically connected to the connection pad 2 with the other end portion extending on the front side protective film 3. Under the state that the wiring 5 is formed by the electroplating, the UBM layer deposited on the entire surface of the front side protective film 3 is left unremoved together with the UBM portion formed by vapor deposition on the dicing frame 20 so as to provide a plating electrode.

After formation of the wirings 5, the columnar electrodes 6 are formed in predetermined positions on the other ends of the wirings 5, as shown in FIG. 14. The columnar electrode 6 can be formed by the process equal to the process shown in FIG. 6 referred to in conjunction with the first embodiment. For example, an open portion exposing the central portion of the other end of each wiring 5 to the outside is formed in a photoresist film having a thickness of about 100 $\mu$m to 150 $\mu$m, followed by applying an electroplating to the open portion, thereby forming the columnar electrode 6. In applying the electroplating, the UBM layer formed by vapor deposition on the entire front surface of the front side protective film 3 and on the dicing frame 20 is used as one of the electrodes. FIG. 14 is a cross sectional view showing in a magnified fashion the state after completion of the process described above.

As described above, in the process of forming the wiring 5 and the columnar electrode 6 shown in FIG. 14, the UBM layer formed by vapor deposition on the dicing frame 20 is left unremoved for use as a plating electrode. It follows that it is possible to perform the electroplating for forming the wiring 5 and the columnar electrode 6 without relying on the conventional method of forming an electrode separately on the silicon wafer 1.

Figure 15:
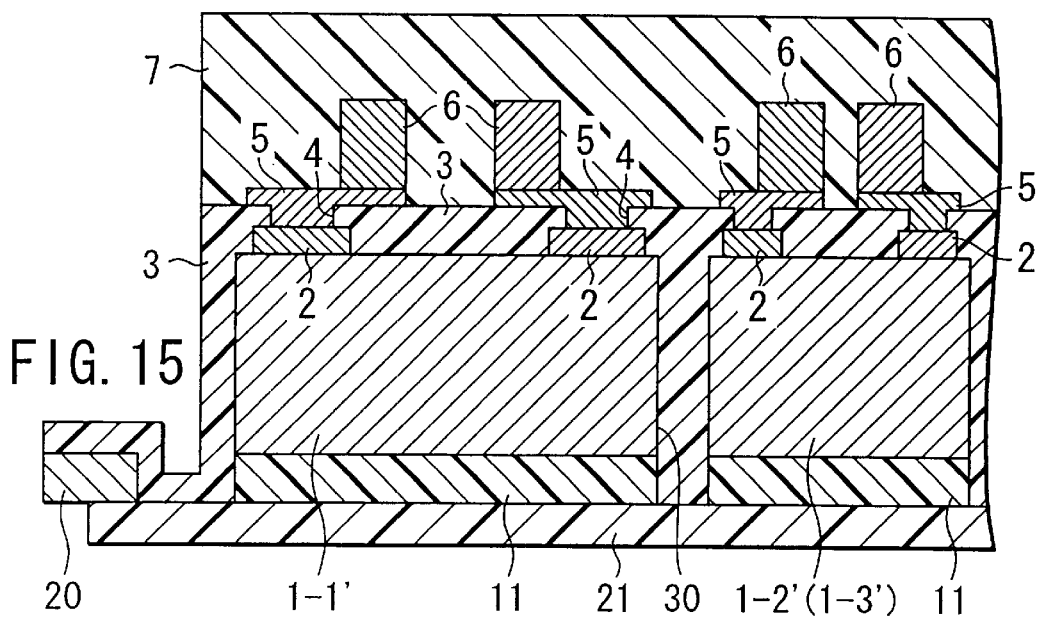
FIG. 15 is a cross sectional view showing in a magnified fashion the manufacturing step following the step shown in FIG. 14 in the manufacturing process according to the second embodiment of the present invention.

After formation of the structure shown in FIG. 14, the sealing film 7 made of a resin material such as polyimide or an epoxy resin is formed by, for example, a molding method on the front side protective film 3 in a manner to cover the entire surface of each semiconductor substrate including each columnar electrode 6 by the process equal to the process shown in FIG. 7 referred to previously in conjunction with the first embodiment, as shown in FIG. 15. It is possible for the sealing film 7 to be of a single layer structure made of polyimide, an epoxy resin, etc. or of a laminate structure of these resin layers. In this case, it is desirable for the sealing film 7 to consist of a resin layer containing a material substantially equal to the main component of the back side protective film 11 in order to ensure the reliability relative to the change in the environment.

Figure 16:
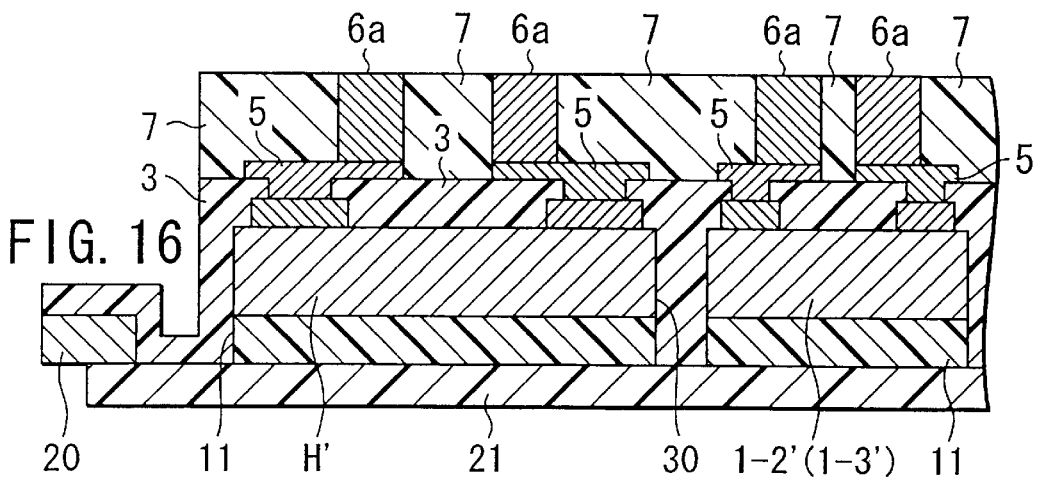
FIG. 16 is a cross sectional view showing in a magnified fashion the manufacturing step following the step shown in FIG. 15 in the manufacturing process according to the second embodiment of the present invention.

After the sealing film 7 is cured, the upper surface of the sealing film 7 is polished so as to expose the edge surface 6a of the columnar electrode 6 to the outside by the process equal to the process shown in FIG. 8 referred to previously in conjunction with the first embodiment, as shown in FIG. 16. A native oxide film is removed from the exposed edge surface 6a, followed by, as required, a metallizing treatment such as a solder printing treatment.

Figure 17:
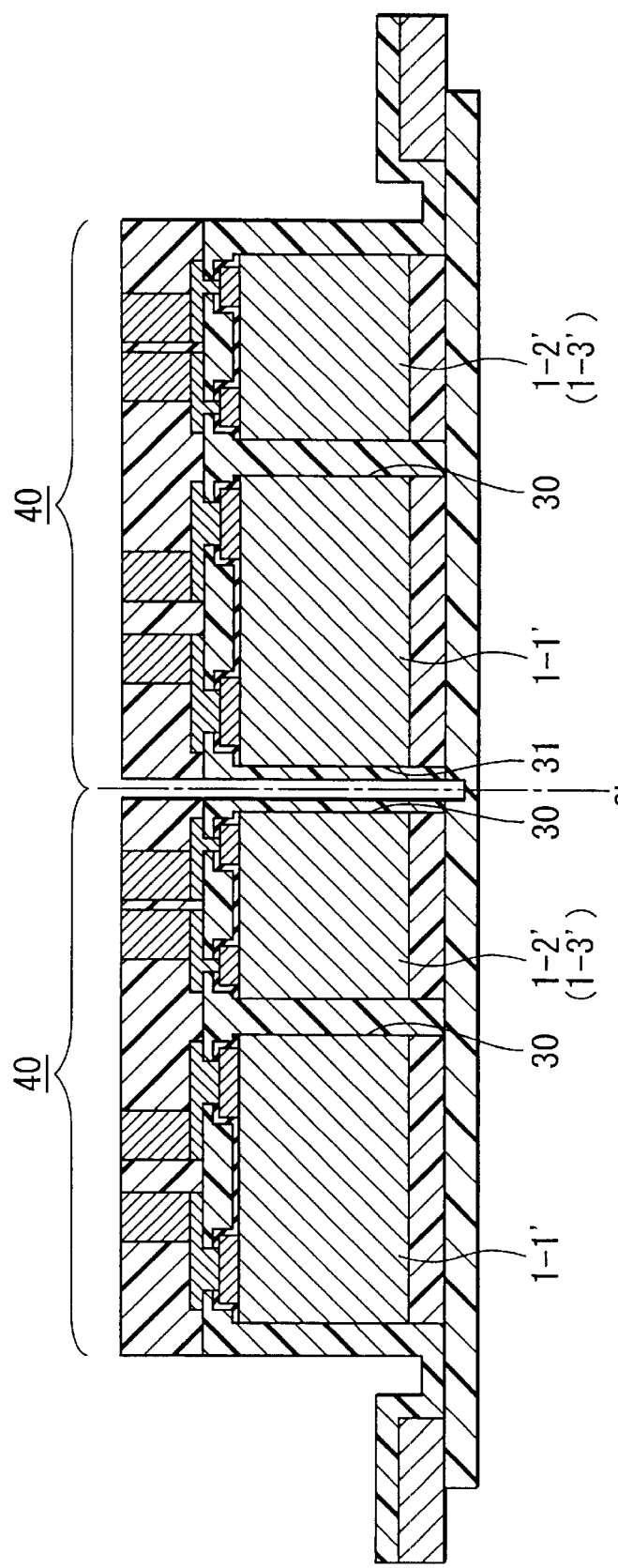
FIG. 17 is a cross sectional view showing in a magnified fashion the manufacturing step following the step shown in FIG. 16 in the manufacturing process according to the second embodiment of the present invention.
Figure 20:
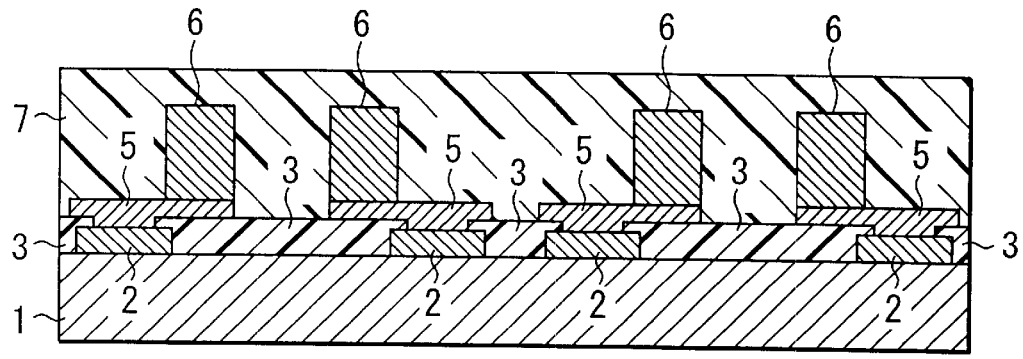
FIG. 20 is a cross sectional view showing in a magnified fashion the manufacturing step following the step shown in FIG. 19.
Figure 21:
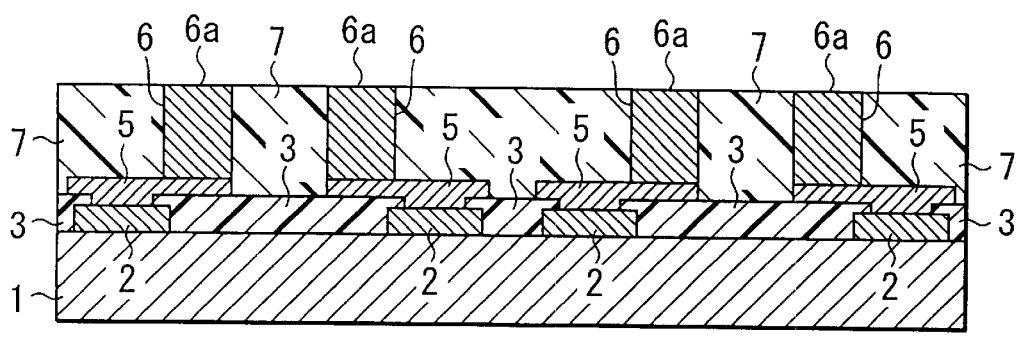
FIG. 21 is a cross sectional view showing in a magnified fashion the manufacturing step following the step shown in FIG. 20.
Figure 22:
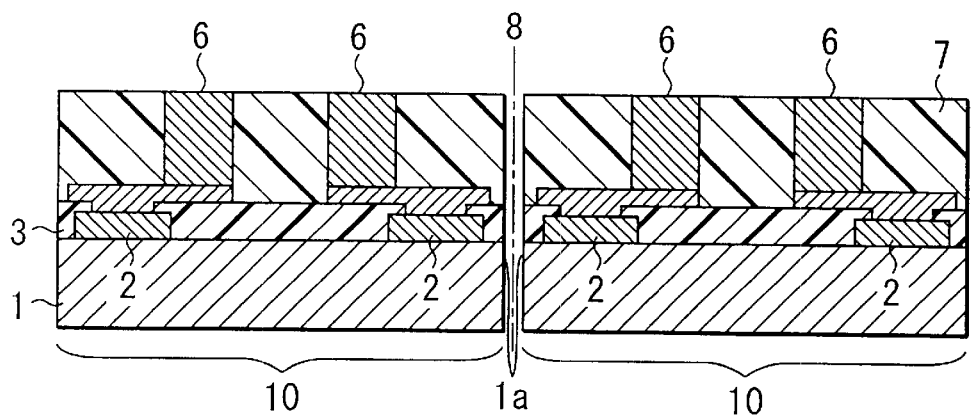
FIG. 22 is a cross sectional view showing in a magnified fashion the manufacturing step following the step shown in FIG. 21.

In the next step, dicing is applied along a cut line CL in the clearance 30 and thus the portion of the front side protective film 3 loaded therein and positioned between the adjacent blocks each consisting of the semiconductor substrates 1-1', 1-2' and 1-3'. As shown in FIG. 17, the dicing is performed with a width smaller than the width of the clearance 30. As a result, the portion of the front side protective film 3 of a predetermined thickness is caused to remain on each of the side surfaces 31 of the adjacent semiconductor substrates facing each other with the clearance 30 interposed therebetween. In other words, the front side protective film 3 of a predetermined thickness is also formed on the circumferential side surface of the multi-chip module formed of a plurality of semiconductor substrates. After the dicing step, the dicing tape 21 is peeled off so as to form individual multi-chip modules, thereby obtaining a plurality of semiconductor devices 40.

As described above, the second embodiment of the present invention is directed to the semiconductor device 40 consisting of a multi-chip module formed of a plurality of different kinds of semiconductor substrates separated from different kinds of silicon wafers. In the second embodiment, the front surface and the side surface of the semiconductor device 40 are entirely covered with the front side protective film 3. Also, the back surface of the semiconductor device 40 is covered with the back side protective film 11. In other words, the entire surface of the semiconductor device 40 is covered with a combination of the protective films. As a result, water is unlikely to enter the boundary region between the sealing film 7 and the front side protective film 3, thereby preventing the wiring 5 from being oxidized. It is also possible to prevent the occurrence of a crack between the sealing film 7 and the front side protective film 3 so as to improve the reliability. Further, it is possible for the back side protective film 11 to suppress the influence of light and electromagnetic waves coming from the back surface. What should also be noted is that, since no surface of the semiconductor substrate is exposed to the outside, it is possible to prevent breakage of the semiconductor substrate, and the handling in the step of transferring the semiconductor device 10 onto a tray is markedly facilitated.

The accompanying drawings show that, in the second embodiment described above, the distances between the adjacent columnar electrodes 6 formed in the three kinds of the semiconductor substrates 1-1', 1-2' and 1-3' are made different to conform with the size of each of these semiconductor substrates. However, it is desirable in practice to make the distances between the adjacent columnar electrodes 6 substantially uniform in order to make the bonding conditions uniform. In this case, it is possible to appropriately set the shape of the wiring 5 formed on the front side protective film 3 on each semiconductor substrate. Alternatively, it is also possible to allow a part of the wiring 5 to extend over the boundary between the adjacent semiconductor substrates so as to be positioned on the adjacent semiconductor substrate, and to mount the columnar electrode 6 on the end portion of the extending portion of the wiring 5.

In the second embodiment described above, the multi-chip module is formed by using as a set a plurality of semiconductor substrates separated from a plurality of different kinds of silicon wafers, e.g., three different kinds of silicon wafers. However, the present invention is not limited to the particular construction. For example, the technical idea of the present invention can also be applied to a multi-chip module prepared by selecting a plurality of the same kind of satisfactory semiconductor substrates separated from the same kind of the silicon wafers and by rearranging these selected semiconductor substrates.

In the second embodiment described above, the multi-chip module is prepared by using a plurality of individual semiconductor substrates. However, it is also possible to apply the technical idea of the present invention to the manufacture of a single chip. To be more specific, in FIGS. 12A to 12D referred to previously, the individual semiconductor substrates for chips are prepared by applying a dicing treatment to a plurality of wafers and, then, the semiconductor substrates for each chip are rearranged. However, in place of the process shown in FIGS. 12A to 12D, it is possible to employ the process shown in FIGS. 18A to 18C. To be more specific, individual semiconductor substrates for each chip are prepared by applying a dicing treatment to the silicon wafer 1, as shown in FIG. 18A. Then, the individual semiconductor substrates are classified into good chips 1G and poor chips 1NG and then the good chips 1G alone are selected, followed by rearranging the selected good chips 1G as shown in, for example, FIG. 18B or 18C. After the rearrangement, the front side protective film 3, the wiring 5, the columnar electrode 6 and the sealing film 7 are formed by the processes shown in FIGS. 13 to 16. Then, dicing is applied to the center of the clearance (and thus the portion of film 3 loaded therein) between the adjacent semiconductor substrates so as to form a module of a single chip. In this case, it is possible to optionally set the arranging interval of the substrates in rearranging the semiconductor substrates, making it possible to ensure a broader clearance between the semiconductor substrates, compared with the case where a cutting groove is formed by dicing the silicon wafer 1, and the semiconductor substrates for each chip are arranged at the interval of the cutting groove as in the first embodiment. As a result, it is possible to ensure a sufficient thickness of the protective film formed on the circumferential side surface of each semiconductor device in forming the semiconductor device by applying a dicing treatment to the clearance between the adjacent semiconductor devices. It should also be noted that, by setting the arranging interval appropriately, it is possible to adjust the size of the finally finished semiconductor device.

In each of the embodiments described above, it is possible to use a photosensitive resin as a material of the front side protective film 3. In this case, it is possible to omit the steps for the coating, curing and peeling of the photoresist used for forming the front side protective film 3.

Also, in each of the embodiments described above, the wiring 5 connected to the connection pad 2 is formed on the front side protective film 3, and the columnar electrode 6 is formed on the wiring 5. However, it is possible to omit formation of the wiring 5 such that the columnar electrode 6 is formed in direct contact with the connection pad 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   at least one semiconductor substrate including a front surface having a plurality of connection pads formed thereon, a back surface opposite to said front surface, and a side surface positioned between said front surface and said back surface;
   a front side protective film which has open portions exposing said plural connection pads formed on the front surface of said semiconductor substrate, and which is formed to cover said side surface and the front surface of said semiconductor substrate;
   a plurality of columnar electrodes which are formed on portions of said front side protective film on the front surface of said semiconductor substrate, and which are electrically connected to said plural connection pads; and
   a sealing film which is formed on a surface of said front side protective film, opposite to the front surface of said semiconductor substrate, between adjacent ones of said columnar electrodes.

2. The semiconductor device according to claim 1, further comprising a back side protective film which is formed to cover the back surface of said semiconductor substrate.

3. The semiconductor device according to claim 2, wherein at least one of said sealing film and said front side protective film contains a material which is a main component of said back side protective film.

4. The semiconductor device according to claim 1, further comprising wirings which connect said connection pads to said columnar electrodes, and which are formed on said front side protective film.

5. The semiconductor device according to claim 1, wherein said semiconductor substrate is a substrate prepared by dicing a semiconductor wafer having a plurality of chip-forming regions.

6. The semiconductor device according to claim 1, wherein said semiconductor substrate is an individual substrate prepared by dicing a plurality of different kinds of semiconductor wafers each having a plurality of chip-forming regions.

7. The semiconductor device according to claim 1, further comprising a back side protective film covering the back surface of said semiconductor substrate; and wherein a marking denoting article information of said semiconductor device is provided on a front surface of said back side protective film.

8. The semiconductor device according to claim 1, wherein said front side protective film comprises a photo-sensitive resin.

9. A semiconductor device, comprising:
   at least one semiconductor substrate including a front surface having a plurality of connection pads formed thereon, a back surface opposite to said front surface, and a side surface interposed between said front surface and said back surface;
   a front side protective film which has open portions exposing said plural connection pads formed on the front surface of said semiconductor substrate, and which is formed to cover said side surface and the front surface of said semiconductor substrate;
   wirings which are electrically connected to said connection pads, and which are formed on said front side protective film;
   columnar electrodes which are formed to contact with said wirings; and
   a sealing film which is formed between adjacent ones of said columnar electrodes on a surface of said front side protective film, opposite to the front surface of said semiconductor substrate.

10. The semiconductor device according to claim 9, further comprising a back side protective film which is formed to cover the back surface of said semiconductor substrate.

11. The semiconductor device according to claim 10, wherein at least one of said sealing film and said front side protective film contains a material which is a main component of said back side protective film.

12. The semiconductor device according to claim 9, wherein said semiconductor substrate is a substrate prepared by dicing a semiconductor wafer having a plurality of chip-forming regions.

13. The semiconductor device according to claim 9, wherein said semiconductor substrate is an individual substrate prepared by dicing a plurality of different kinds of semiconductor wafers each having a plurality of chip-forming regions.

14. The semiconductor device according to claim 9, wherein said front side protective film comprises a photo-sensitive resin.

* * * * *